United States Patent [19]

Thommen et al.

[11] 3,962,592

[45] June 8, 1976

[54] CURRENT SOURCE CIRCUIT ARRANGEMENT

[75] Inventors: Werner Thommen, Uitikon; Arpad Korom, Zurich, both of Switzerland

[73] Assignee: U.S. Philips Corporation, New York, N.Y.

[22] Filed: May 15, 1974

[21] Appl. No.: 470,273

[30] Foreign Application Priority Data

May 28, 1973 Netherlands ...................... 7307378

[52] U.S. Cl. ................................ 307/297; 307/303; 330/22; 330/40

[51] Int. Cl.² ............................................ H03F 3/18

[58] Field of Search ........................... 307/297, 303; 330/17–19, 38 M, 22, 40

[56] References Cited

UNITED STATES PATENTS

| | | | |
|---|---|---|---|
| 3,813,607 | 5/1974 | Voorman | 330/17 |
| 3,843,933 | 10/1974 | Ahmed | 307/297 X |

*Primary Examiner*—Siegfried H. Grimm
*Attorney, Agent, or Firm*—Frank R. Trifari; Ronald L. Drumheller

[57] ABSTRACT

A current source circuit degeneratively feeds back a control signal to a current mirror circuit via a single stage amplifier in order to reduce instabilities resulting from use of more than one stage.

8 Claims, 3 Drawing Figures

CURRENT SOURCE CIRCUIT ARRANGEMENT

Figure 1:
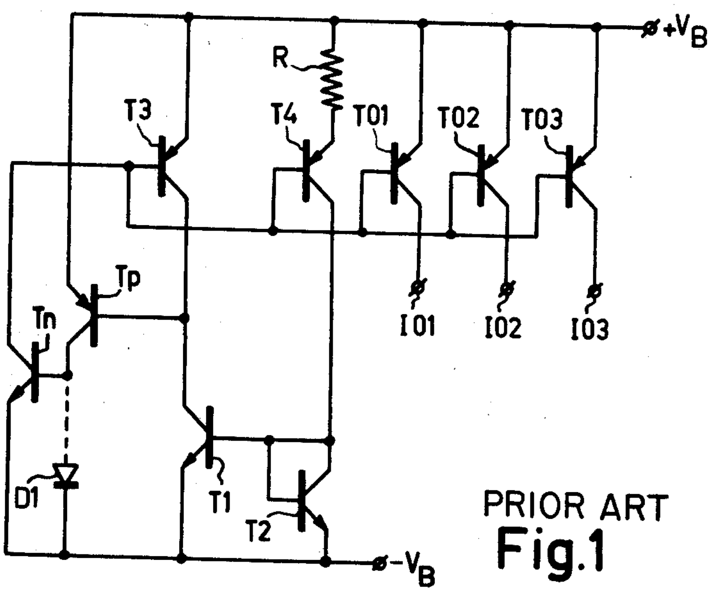
PRIOR ART Fig.1

The invention relates to a current source circuit arrangement for supplying one or more constant currents which comprises a first current circuit and a second current circuit between a first supply terminal and a second supply terminal, the first current circuit including the series combination of the main current path of a first transistor of a first conductivity type and the main current path of a second transistor of a second conductivity type, whilst the second current circuit includes the main current path of a third transistor of the first conductivity type and a diode or a transistor connected as a diode, a resistor being connected in one of the two current circuits between one of the semiconductor elements and one of the supply terminals, whilst the interconnection of the control electrodes of the first and third transistors and the interconnection of the control electrode of the second transistor and of an electrode of the diode or transistor connected as a diode ensure that in both current circuits currents flow the magnitudes of which are in a fixed ratio and which have absolute values which are determined by this ratio and by the value of the resistor, whilst furthermore there is fed back degeneratively to the control electrodes of the first and third transistors a control signal supplied by a direct-current amplifier the input of which is connected to the common electrodes of the first and second transistors in the first current circuit.

Such a current source circuit arrangement is described for example in U.S. Pat. No. 3,813,607. To enable currents of accurately determined values to be produced by such a current source circuit several conditions are to be satisfied. Firstly it must be ensured that the ratio between the two currents in the first and second circuits is fixed as accurately as possible. Secondly attempts should be made to design a circuit arrangement which is as stable as possible, because a system such as the circuit arrangement under consideration which forms a complete loop is liable to become unstable. Thirdly in many cases a circuit arrangement is desired which requires only a small supply voltage.

It has been found that it is very difficult to satisfy all three requirements at the same time. It is an object of the present invention to provide a current source circuit arrangement of the type described which largely satifies the said requirements.

For this purpose the invention is characterized in that the said direct current amplifier has only a single amplifier stage which furthermore includes transistors of the second conductivity type only.

The arrangement according to the invention firstly ensures that the likelihood of undesirable phase shifts in the direct-current amplifier which may give rise to instability of the current source circuit is reduced to a minimum.

Depending upon the point at which the resistor is inserted into the two current circuits the direct-current amplifier may either comprise a differential stage employing two transistors connected as a long-tailed pair or only one transistor. The latter implementation has the additional advantage of ensuring the symmetry of the two current circuits. Both possible arrangements permit the use of a very simple starting circuit. In the second arrangement this is achieved by connecting the main current path of a further transistor in parallel with the main current path of the said transistor. Applying a reference voltage to the control electrode of the further transistor and including an impedance in the common emitter lead of these two transistors will ensure that the current source circuit arrangement is automatically started, whilst in operation of the circuit arrangement the further transistor exerts no influence.

Embodiments of the circuit arrangement according to the invention will now be described, by way of example, with reference to the accompanying diagrammatic drawings, in which:

FIG. 1 shows the known current source circuit arrangement and

Figure 2:
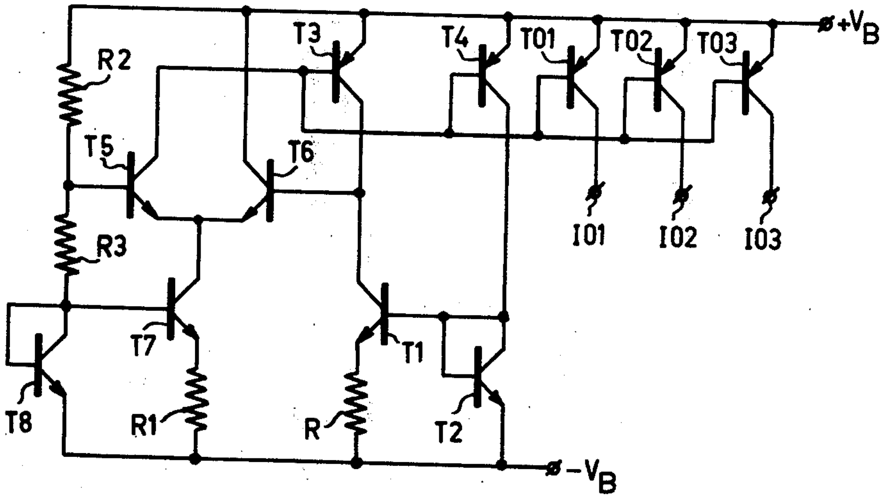
Figure 3:
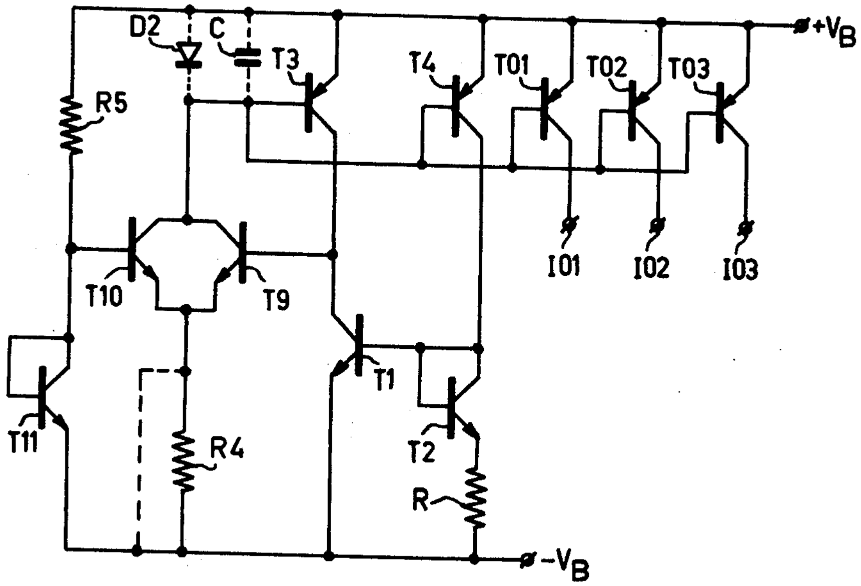

FIGS. 2 and 3 each show an embodiment of the current source circuit arrangement according to the invention.

In the figures corresponding elements are designated by the same reference numerals and letters.

The known current source circuit arrangement shown in FIG. 1 has a first current circuit which comprises the series combination of the emitter collector path of a pnp transistor $T_3$ and the collector-emitter path of a npn transistor $T_1$ between a positive supply terminal $+V_B$ and a negative supply terminal $-V_B$. A second circuit between these two supply terminals comprises the series combination of a resistor R, the emitter collector path of a pnp transistor $T_4$ and an npn transistor $T_2$ connected as a diode. The interconnected base and collector of the transistor $T_2$ are connected to the base of the transistor $T_1$, and the bases of the transistors $T_3$ and $T_4$ also are interconnected.

The current mirror comprising the transistors $T_1$ and $T_2$ ensures that the currents which flow in the two circuits are in a fixed ratio to one another. This ratio is determined by the ratio between the emitter areas of the two transistors $T_1$ and $T_2$ which are in integrated circuit form.

When designing such a current source circuit arrangement in principle the designer can follow two courses. It can be ensured that equal currents flow in both current circuits by making the emitter areas of the transistors $T_1$ and $T_2$ equal to one another. To permit stabilized currents to flow in both current circuits, in this embodiment the emitter area of the transistor $T_4$ must be greater than that of the transistor $T_3$. The second course is to make the emitter area of the transistor $T_2$ smaller than that of the transistor $T_1$ with the result that the current flowing in the second circuit is smaller than that flowing in the first circuit. In this embodiment the emitter areas of the transistors $T_3$ and $T_4$ may be equal. Obviously, a combination of both courses is possible and furthermore different emitter areas may be obtained by connecting several transistors in parallel with one another.

Current source circuit arrangements of the above described kind generally are used for controlling a plurality of pnp transistors $T_{01}$, $T_{02}$, $T_{03}$, etc., which transistors frequently are used in an integrated circuit to replace resistive components. In this case the transistors have their emitter base paths connected in parallel with the emitter base path of the transistor $T_3$. Because in integrated circuit technology the pnp transistors $T_3$, $T_4$, $T_{01}$, $T_{02}$, $T_{03}$, etc. usually are in the form of lateral transistors, which generally have a comparatively small current amplification factor, and because moreover generally the greatest possible number of transistors are to be controlled, the bases of these transistors preferably are controlled via a direct-current amplifier, for if no direct-current amplifier were used but the transistor $T_3$ were connected as a diode, the desired ratio between the two currents in the circuits would be considerably disturbed.

In this known circuit arrangement the direct-current amplifier comprises a pnp transistor $T_p$ the base of which is connected to the collector of the transistor $T_3$ and the emitter of which is connected to the positive supply terminal $+V_B$. The collector of the transistor $T_p$ is connected to the base of a npn transistor $T_n$ having its emitter connected to the negative supply terminal and its collector to the base of the transistor $T_3$. This direct-current amplifier thus comprises two amplifier stages, namely the transistor $T_p$ and the transistor $T_n$.

It has been found that in the worst case condition this two-stage design may give rise to instability of the circuit arrangement, because the transistors $T_p$ and $T_n$ each produce a phase shift which greatly increases as a function of frequency. To ensure stability of the circuit arrangement an external capacitance may naturally be added. Also, as is shown in the figure, the overall gain of the direct-current amplifier may be reduced. For this purpose a diode $D_1$ may be connected in parallel with the base emitter path of the transistor $T_n$ so that a current mirror having for example unity current amplification factor is obtained. Because the current amplification factor of a pnp transistor $T_p$ in the form of a lateral transistor generally is comparatively small also, the overall gain of the direct-current amplifier is comparatively small, reducing the likelihood of instability. A disadvantage of the latter method is that this direct-current amplifier absorbs a comparatively large input current so that the ratio between the currents in the two current circuits is considerably affected.

FIG. 2 shows a first embodiment of a current source circuit arrangement according to the invention. Similarly to the arrangement shown in FIG. 1 it has a first current circuit comprising the transistors $T_1$ and $T_3$ and a second current circuit comprising the transistors $T_2$ and $T_4$, the transistor $T_2$ being connected as a diode. A resistor R is connected in the emitter circuit of the transistor $T_1$ but may alternatively be connected in the emitter circuit of the transistor $T_4$. What has been mentioned with regard to the ratio between the currents in the two circuits and the ratio between the emitter areas of the transistors in the arrangement of FIG. 1 also applies to the arrangement of FIG. 2.

The direct-current amplifier is in the form of a differential amplifier comprising npn transistors $T_5$ and $T_6$. The base of the transistor $T_6$ is connected to the collectors of the transistors $T_1$ and $T_3$, a reference voltage being applied to the base of the transistor $T_5$. The value of this reference voltage is not of importance and entirely uncritical. In the embodiment shown the reference voltage is derived from the supply voltage by means of resistors $R_2$ and $R_3$ and a transistor $T_8$ connected as a diode. A current source for the differential amplifier is formed by a transistor $T_7$ which has an emitter resistor $R_1$ and to the base of which a voltage is applied by the transistor $T_8$. This part of the current source circuit arrangement also serves as a starting circuit. As is known, current source circuit arrangements of the kind under consideration generally also have an undesirable stable condition in which all the currents are zero. The provision of the resistors $R_2$, $R_3$ and $R_1$ ensures that when the supply voltage is switched on the transistors $T_5$ and $T_7$ always are conducting so that the transistors $T_3$ and $T_4$ always have base current supplied to them by the transistor $T_5$, resulting in that the current source circuit arrangement automatically assumes the desirable stable condition. The collector of the transistor $T_6$ is connected to the positive supply terminal whilst the collector of the transistor $T_5$ is connected to the bases of the output transistors $T_{01}$, $T_{02}$, $T_{03}$, etc. and, as mentioned above, to the bases of the transistors $T_3$ and $T_4$.

The embodiment shown of the direct-current amplifier has the advantage that the ensuing phase shift is restricted because the amplifier comprises a single stage only. Because the amplifier moreover comprises transistors of the same conductivity type only, the variation of the phase shift as a function of the frequency is better defined. Hence the stability of this current source circuit arrangement is ensured with more certainty than in the known circuit arrangement.

A second embodiment of the current source circuit arrangement according to the invention is shown in FIG. 3. Similarly to the two abovedescribed circuit arrangements two current circuits including transistors $T_3$, $T_1$ and $T_4$, $T_2$ respectively are provided. The resistor R, however, now is connected in series with the transistor $T_2$ connected as a diode, but alternatively it may be included in the emitter circuit of the transistor $T_3$. The direct-current amplifier now comprises a single npn transistor $T_9$ the base of which is connected to the collector of the transistor $T_1$ and the collector of which is connected to the bases of the transistors $T_3$, $T_4$, $T_{01}$, $T_{02}$ and $T_{03}$.

The emitter of the transistor $T_9$ may directly be connected to the negative supply terminal (see broken line). Compared with the circuit arrangement shown in FIG. 2 the circuit arrangement of FIG. 3 has the advantage of ensuring that the transistor $T_1$ and the transistor $T_2$ connected as a diode have substantially identical properties, for if the emitter of the transistor $T_9$ is directly connected to the negative supply terminal $-V_B$, the collector voltage of the transistor $T_1$ automatically is approximately equal to its base voltage, because both voltages are equal to the sum of the negative supply voltage and one base emitter voltage $V_{be}$. This means that the transistor $T_1$ operates with a collector base voltage which is substantially zero. Because the collector base voltage of the transistor $T_2$ automatically is zero, the two transistors operate at the same collector base voltage so that their characteristics are largely equal and hence the symmetry of the two current circuits is ensured.

A disadvantage of this circuit arrangement when compared with the circuit arrangement of FIG. 2 is the slightly lower stability so that it may be necessary to connect a capacitor C in parallel with the base emitter path of the transistor $T_3$ to completely avoid the likelihood of instability. Alternatively a diode may be connected in parallel with the emitter base path of the transistor $T_3$, thereby reducing the amplification.

A starting circuit for the embodiment shown in FIG. 3 can simply be obtained by connecting the collector emitter path of a transistor $T_{10}$ in parallel with the collector emitter path of the transistor $T_9$. This ensures that when the supply voltage is switched into circuit the transistor $T_{10}$ will become conducting so that the transistors $T_3$ and $T_4$ also will pass current. As a result the transistor $T_9$ also will become conducting, so that switching the supply into circuit will with certainty cause the arrangement to assume the desired stable condition. The insertion of a suitable resistor $R_4$ in the common emitter lead of the transistors $T_9$ and $T_{10}$ permits of ensuring that when the transistor $T_9$ has become conducting the transistor $T_{10}$ will become cut off and consequently have no longer any influence.

It should be mentioned that the direct-current amplifiers used in FIGS. 2 and 3 may also be employed to advantage in current source circuit arrangements in which a current stability principle other than that described is used, for current source circuit arrangements exist in which a first current circuit comprising the series combination of at least one resistor and a diode is connected between the two supply terminals. The diode then is connected in parallel with the series combination of the base emitter path of a transistor and a resistor. The collector current of this transistor is the desired current which can be made available at a plurality of output terminals by means of a multiple current mirror comprising one input transistor and a plurality of output transistors. Base drive of all these transistors having their base emitter paths connected in parallel may again be effected by means of a differential amplifier, as shown in FIG. 2, or of a single transistor, as shown in FIG. 3.

What is claimed is:

1. A current source circuit, comprising;

first and second voltage supply terminals;

a first transistor of first conductivity type having an emitter connected to said first supply terminal and having a base and a collector;

a second transistor of second conductivity type having a collector connected to said collector of said first transistor and having a base and an emitter;

a third transistor of said first conductivity type having a base connected to said base of said first transistor, having a collector connected to said base of said second transistor and having an emitter;

first connection means connecting said emitter of said second transistor to said second supply terminal;

second connection means connecting said emitter of said third transistor to said first supply terminal, one of said connection means being an impedance and the other of said connection means being a direct electrical connection;

a diode connected between said collector of said third transistor and said second supply terminal;

a fourth transistor of said second conductivity type having a collector connected to said first supply terminal, having a base connected to said collector of said first transistor and having an emitter;

a fifth transistor of said second conductivity type having a collector connected to said base of said first transistor, having an emitter connected to said emitter of said fourth transistor and having a base;

means for applying a reference voltage to said base of said fifth transistor;

means for supplying a constant current to said connected emitters of said fourth and fifth transistors; and at least one output transistor of said first conductivity type having an emitter connected to said first supply terminal, having a base connected to said collector of said fifth transistor and having a collector for current output.

2. A current source circuit as defined in claim 1 wherein said means for supplying a constant current and said means for applying a reference voltage comprise:

a sixth transistor of said second conductivity type having a collector connected to said connected emitters of said fourth and fifth transistors and having a base and an emitter;

an impedance connected between said emitter of said sixth transistor and said second supply terminal;

an impedance connected between said base of said fifth transistor and said first supply terminal;

an impedance connected between said base of said sixth transistor and said base of said fifth transistor; and n a diode connected between said base of said sixth transistor and said second supply terminal.

3. A current source circuit comprising:

first and second voltage supply terminals;

a first transistor of first conductivity type having an emitter, a base and a collector;

a second transistor of second conductivity type having a collector connected to said collector of said first transistor, having an emitter connected to said second supply terminal and having a base;

a third transistor of said first conductivity type having an emitter connected to said first supply terminal, having a base connected to said base of said first transistor and having a collector connected to said base of said second transistor;

a diode having a first electrode connected to said collector of said third transistor and having a second electrode;

first connection means connecting said emitter of said first transistor to said first supply terminal;

second connection means connecting said second electrode of said diode to said second supply terminal, one of said connection means being an impedance and the other of said connection means being a direct electrical connection;

a fourth transistor of said second conductivity type having a collector connected to said base of said first transistor, having a base connected to said collector of said first transistor and having an emitter;

third connection means connecting said emitter of said fourth transistor to said second supply terminal; and at least one output transistor of said first conductivity type having an emitter connected to said first supply terminal, having a base connected to said collector of said fourth transistor and having a collector for current output.

4. A current source circuit as defined in claim 3 wherein said third connection means is a direct electrical connection.

5. A current source circuit as defined in claim 4 and further comprising a capacitance connected between said base of said first transistor and said first supply terminal.

6. A current source circuit as defined in claim 4 and further comprising a diode connected between said base of said first transistor and said first supply terminal.

7. A current source circuit as defined in claim 3 wherein said third connection means comprises an impedance and said current source circuit further comprises:

a fifth transistor of said second conductivity type having a collector connected to said collector of said fourth transistor, having an emitter connected to said emitter of said fourth transistor and having a base; and means for applying a reference voltage to said base of said fifth transistor.

8. A current source circuit as defined in claim 7 wherein said means for applying a reference voltage comprises:

an impedance connected between said base of said fifth transistor and said first supply terminal; and a diode connected between said base of said fifth transistor and said second supply terminal.

* * * * *